United States Patent
Chhatpar et al.

(10) Patent No.: US 6,805,291 B2
(45) Date of Patent: *Oct. 19, 2004

(54) METHOD FOR FIELD PROGRAMMABLE RADIO FREQUENCY DOCUMENT IDENTIFICATION DEVICES

(75) Inventors: Anand V. Chhatpar, Madison, WI (US); Jeffrey D. Pierce, Sandy Hook, CT (US); Brian M. Romansky, Monroe, CT (US); Thomas J. Foth, Trumbull, CT (US); Andrei Obrea, Seymour, CT (US)

(73) Assignee: Pitney Bowes Inc., Stamford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/431,066

(22) Filed: May 7, 2003

(65) Prior Publication Data

US 2004/0074960 A1 Apr. 22, 2004

Related U.S. Application Data

(60) Provisional application No. 60/419,361, filed on Oct. 18, 2002.

(51) Int. Cl.$^7$ .............................. G06K 15/00; G06K 7/10
(52) U.S. Cl. ................... 235/383; 235/462.46; 235/487; 235/435; 235/461; 307/116; 340/10.4; 340/10.41; 340/10.42
(58) Field of Search .................... 307/116; 340/10.4, 340/10.42, 10.41, 412; 178/18.01; 235/383, 462.46, 487, 435, 461, 376, 378, 379, 380, 382.5, 385, 492, 462.01; 455/41.2, 151.2; 365/191, 192

(56) References Cited

U.S. PATENT DOCUMENTS 3,541,706 A * 11/1970 Shapiro ...................... 434/117
3,705,047 A * 12/1972 Marriott ........................ 427/96
3,784,795 A * 1/1974 Tuhro ........................... 235/454
4,195,772 A * 4/1980 Nishimura .................... 235/441
4,288,537 A * 9/1981 Knetzger ..................... 434/169
4,889,961 A * 12/1989 Carlson ........................ 174/261
5,184,003 A * 2/1993 McMillin et al. ........... 235/454
5,604,485 A * 2/1997 Lauro et al. .............. 340/572.5
5,962,834 A * 10/1999 Markman .................... 235/385
6,111,506 A   8/2000 Yap et al.
6,436,516 B1  8/2002 Nagashima et al.
6,480,100 B1 * 11/2002 Frieden et al. ............. 340/10.1
6,557,768 B2 * 5/2003 Yap et al. ..................... 235/492
6,628,199 B1 * 9/2003 Ehrensvard et al. ..... 340/568.1
2001/0006194 A1  7/2001 Kayanakis et al.

FOREIGN PATENT DOCUMENTS

| DE | 19947180 A1 | 4/2001 | |
| DE | 20106542 U1 | 7/2001 | |
| DE | 10016716 A1 | 8/2001 | |
| JP | 2003037522 A * | 2/2003 | ............ H04B/1/59 |
| WO | WO 01/91045 A1 | 11/2001 | |

* cited by examiner

Primary Examiner—Thien M. Le
Assistant Examiner—Daniel Walsh
(74) Attorney, Agent, or Firm—Ronald Reichman; Angelo N. Chaclas

(57) ABSTRACT

A method that allows one to mark information with a pencil on a material equipped with a RFID type circuit, and have the marked information stored in a RFID circuit that is a component of a personal identification system and/or a document identification system. The marked entered information may be corrected by erasing the written information with a pencil eraser and writing new information on paper with a pencil. Information may also be marked into a RFID circuit and have the marked information stored in the RFID circuit by utilizing a standard ink jet computer printer to print lines on paper equipped with a RFID type circuit, by having the printed lines perform the function of wires.

16 Claims, 7 Drawing Sheets

353

MR. JONES
ABC, INC.
276 FIFTH AVE.
NEW YORK, N.Y. 100

DEAR MR. JONES:
PLEASE SEND ME YOUR
MODEL 123 RECORDER.

SINCERELY
JOHN SMITH

METHOD FOR FIELD PROGRAMMABLE RADIO FREQUENCY DOCUMENT IDENTIFICATION DEVICES

This Application claims the benefit of the filing date of U.S. Provisional Application No. 60/419,361 filed Oct. 18, 2002, which is owned by the assignee of the present Application.

CROSS REFERENCE TO RELATED APPLICATIONS

Reference is made to commonly assigned co-pending patent applications Docket No. F-633 filed herewith entitled "METHOD FOR FIELD PROGRAMMING RADIO FREQUENCY IDENTIFICATION DEVICES THAT CONTROL REMOTE CONTROL DEVICES" in the names of Jeffrey D. Pierce, Brian M. Romansky, Thomas J. Foth, and Anand V. Chhatpar; Docket No. F-635 filed herewith entitled "METHOD FOR FIELD PROGRAMMABLE RADIO FREQUENCY IDENTIFICATION TESTING DEVICES FOR TRANSMITTING USER SELECTED DATA" in the names of Thomas J. Foth, Brian M. Romansky, Jeffrey D. Pierce, Andrei Obrea, and Anand V. Chhatpar; Docket No. F-637 filed herewith entitled "METHOD FOR FIELD PROGRAMMABLE RADIO FREQUENCY IDENTIFICATION DEVICES TO PERFORM SWITCHING FUNCTIONS" in the names of Andrei Obrea, Brian Romansky, Thomas J. Foth, Jeffrey D. Pierce, and Anand V. Chhatpar; Docket No. F-638 filed herewith entitled "METHOD FOR FIELD PROGRAMMING RADIO FREQUENCY IDENTIFICATION LABELS" in the names of Thomas J. Foth, Brian M. Romansky, Jeffrey D. Pierce, and Anand V. Chhatpar; Docket No. F-639 filed herewith entitled "METHOD FOR FIELD PROGRAMMING RADIO FREQUENCY IDENTIFICATION RETURN FORMS" in the names of Jeffrey D. Pierce, Thomas J. Foth, Brian M. Romansky, Andrei Obrea, and Anand V. Chhatpar; and F-640 filed herewith entitled "METHOD AND APPARATUS FOR FIELD PROGRAMMING RADIO FREQUENCY IDENTIFICATION DEVICES" in the names of Brian M. Romansky, Thomas J. Foth, Jeffrey D. Pierce, Andrei Obrea and Anand V. Chhatpar.

FIELD OF THE INVENTION

This invention pertains to electronic circuits and, more particularly, to programmable radio frequency document identification devices.

BACKGROUND OF THE INVENTION

RFID tags and RFID systems have been used for employee personal identification in automated gate sentry applications protecting secured buildings or areas and in document identification systems that contain RFID tags that are affixed to the document. The user of an RFID tag contained in a personal identification badge or the holder of a document containing a RFID tag would place the RFID tag near a device that transmits an excitation signal to the RFID tag in a manner that the RFID tag would communicate the information stored in the RFID tag back to the device.

One of the problems with the above was that the manufacturer of the tags programmed the information stored in the RFID tags. Thus, the manufacture of the tags would know confidential information regarding the party wanting to protect secured buildings, secured areas and/or documents.

One method utilized by the prior art that avoided giving the RFID manufacturer the party's confidential information involved establishing a database that was related to the information stored in the RFID tags. For instance, if the number 1000 was stored in a RFID tag the number 1000 may represent the employee John Doe in the related database.

The prior art attempted to solve the foregoing problem by providing RFID writers to parties that are protecting several buildings, several areas and/or secured documents. RFID writers are expensive.

SUMMARY OF THE INVENTION

This invention overcomes the disadvantages of the prior art by providing a method that allows one to mark information with a pencil or conductive ink on a material equipped with a RFID type circuit, and have the marked information transmitted by the RFID circuit. The material may be any cellulose type product, i.e., paper, cardboard, chipboard, wood or plastic, fabric, animal hide, etc. The marked entered information may be corrected by erasing the written information with a pencil eraser and writing new information on paper with a pencil. Information may also be marked into a RFID circuit and have the marked information transmitted by the RFID circuit by utilizing a standard ink jet computer printer to print lines on paper equipped with a RFID type circuit, by having the printed lines perform the function of wires. The aforementioned printed information may be modified by having an individual connect different printed wires by drawing a penciled line between the wires.

This invention accomplishes the foregoing by utilizing the RFID serial number generation portion of the RFID circuit that is used when the RFID circuit is being read. In the prior art, the bits used to encode one's and zero's into the generation portion of the RFID circuit were typically fixed. This invention utilizes the serial number generation portion of the RFID circuit by exposing on a piece of paper some or all of the bits left open or closed to represent a binary values, i.e., ones or zeros. A user may complete the RFID serial number storage portion of the RFID circuit by filling in the space between the connections with a pencil to alter the binary values. Alternatively, the serial number generation portion of the RFID circuit may be exposed on a piece of paper with all of the connections made, and a user may break a space between the connections with a sharp instrument or hole punch to alter the binary values. Alternatively, the serial number generation portion of the RFID circuit may have some of the bits all ready left open or closed to represent a unique number.

An additional advantage of this invention is that a party will be able to program their own RFID employee personal identification devices and their own RFID document identification devices.

BRIEF DESCRIPTION OF THE DRAWINGS

FIG. 5 is a drawing showing how a document has markings in order to enable a RFID modified circuit to identify the document.

DETAILED DESCRIPTION OF THE PREFERRED EMBODIMENT

Figure 1:
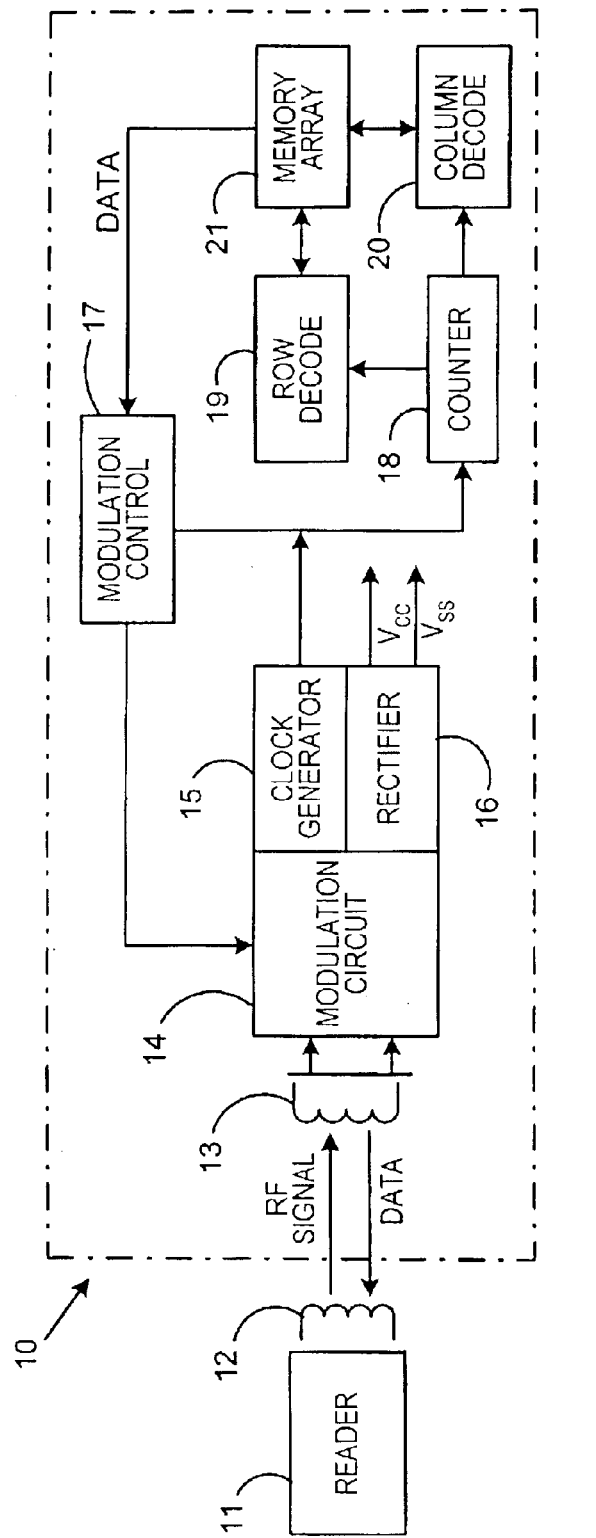
FIG. 1 is a block diagram of a prior art RFID circuit.

Referring now to the drawings in detail, and more particularly to FIG. 1, the reference character 10 represents a prior art RFID circuit. Circuit 10 may be the model MCRF 200 manufactured by Microchip Technology, Inc. of 2355 West Chandler Blvd, Chandler, Ariz. 85224. RFID reader 11 is connected to coil 12, and 12 is coupled to coil 13. Coil 13 is connected to modulation circuit 14. Modulation circuit 14 is connected to clock generator 15 and rectifier 16. Modulation control 17 is coupled to modulation circuit 14, clock generator 15 and counter 18. Counter 18 is coupled to column decode 20. Row decode 19 is coupled to memory array 21, and array 21 is coupled to modulation control 17. It would be obvious to one skilled in the art that a battery may be used to supply power to circuit 10.

Reader 11 has a transmitter mode and a receiver mode. During the transmit mode of reader 11, reader 11 transmits a radio frequency signal for a burst of time via coil 12. After the transmission of a signal by reader 11, reader 11 turns into a receiver. Coil 12 is inductively linked with coil 13, and coil 13 receives the radio frequency signal from coil 12 and converts the aforementioned signal into inductive energy, i.e., electricity. When coil 13 has sufficient energy, coil 13 will cause clock generator 15 to generate timing pulses which drive counter 18. Counter 18 drives row decode 19 which causes memory array 21 to read the fixed bit data pattern stored in memory array 21 one bit at a time. As the data bits are being read by array 21, the data bits are transmitted to modulation control circuit 17. Control circuit 17 sends the data bits to reader 11 via modulation circuit 14 and coils 13 and 12.

Figure 2A:
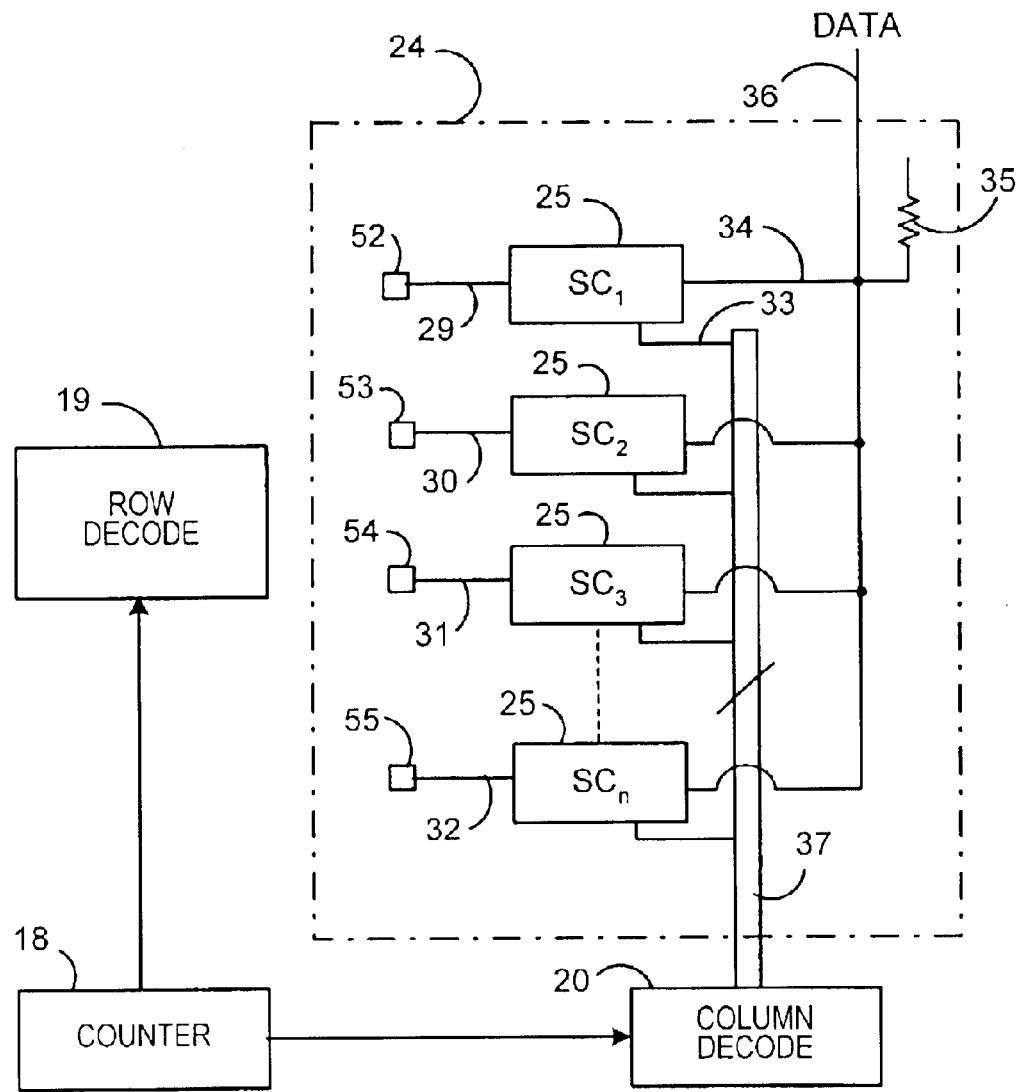
FIG. 2A is a drawing of a circuit 24 that replaces memory array 21 of FIG. 1 showing how programming of the bits may be accomplished by making the bits externally available for programming RFID circuit 10.

FIG. 2A is a drawing of a circuit 24 that replaces memory array 21 of FIG. 1 showing how programming of the bits may be accomplished by making the bits externally available for programming RFID circuit 10. A plurality of sensor circuits 25 is contained in circuit 24. Sensor circuits 25 are labeled $SC_1$ $SC_2$ $SC_3$ ... $Sc_n$. Line 29 is connected to $SC_1$ and graphite contact 52 and line 30 is connected to $SC_2$ and graphite contact 53. Line 31 is connected to $SC_3$ and graphite contact 54 and line 32 are connected to $SC_n$ and graphite contact 55. There is a sensor circuit 25 for each graphite contact. The description of FIG. 4 will describe how information may be entered into circuit 24 via graphite contacts 52–55. $SC_1$ has an input 33, which enables the data output 34. Input 33 is connected to one of the n lines 37, and data output 34 is connected to data line 36 and pull up resistor 35. Data line 36 is connected to modulation control 17 (FIG. 1).

When counter 18 selects the value 1, column decode 20 will enable line 33, which will cause the same logic level that is on graphite contact 52 to be placed on data output 34. When line 33 is not selected, the value on graphite contact 52 does not have any influence on the data output line 34. Enable outputs 33 for $SC_1$ ... $SC_n$ are bundled together in lines 37 so that only one line 37 is turned on at a time. Lines 37 are connected to column decode 20. Column decode 20 is connected to counter 18, and counter 18 is connected to row decode 19. Counter 18 generates a sequence of numbers from 1 through n to enable a different line 37 in sequential order. Thus, data line 36 will receive the data outputs 34 from $SC_1$ ... $SC_n$ at different times.

Figure 2B:
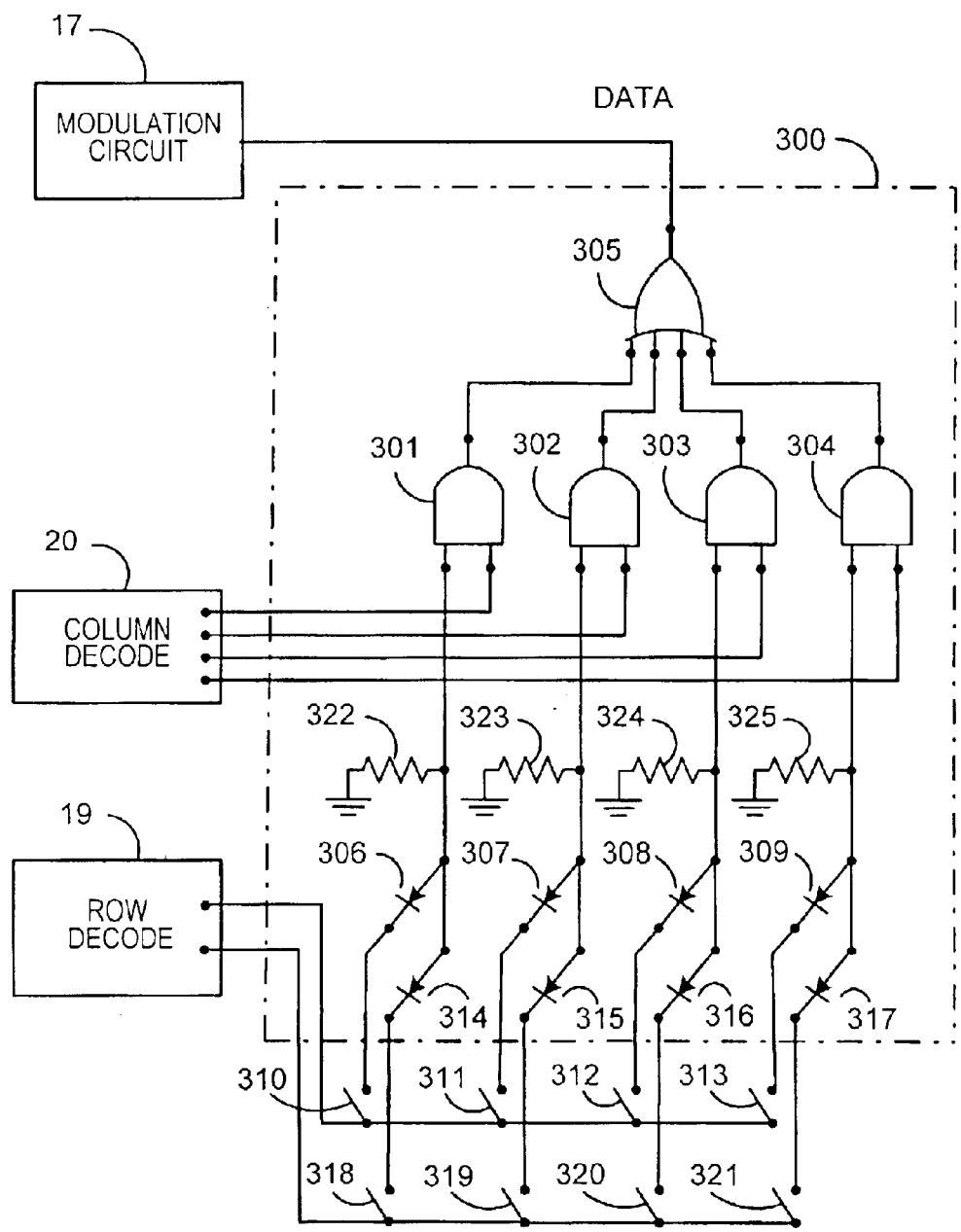
FIG. 2B is a drawing of a circuit 300 that is an alternate representation of circuit 24, that replaces memory array 21 of FIG. 1 showing how programming of the bits may be accomplished by making the bits externally available for programming RFID circuit 10.

FIG. 2B is a drawing of a circuit 300 that is an alternate representation of circuit 24, that replaces memory array 21 of FIG. 1 showing how programming of the bits may be accomplished by making the bits externally available for programming RFID circuit 10. Circuit 300 includes AND gates 301, 302, 303 and 304 and OR gate 305.

One of the inputs of AND gate 301 is connected to column decode 20 and the other input to AND gate 301 is connected to one of the ends of resistor 322, one of the ends of diode 306 and one of the ends of diode 314. The other end of resistor 322 is connected to ground. The other end of diode 306 is connected to one of the terminals of toggle switch 310, and the other end of toggle switch 310 is connected to row decode 19. The other end of diode 314 is connected to one of the terminals of toggle switch 318, and the other end of toggle switch 318 is connected to row decode 19.

One of the inputs of AND gate 302 is connected to column decode 20, and the other input to AND gate 302 is connected to one of the ends of resistor 323, one of the ends of diode 307 and one of the ends of diode 315. The other end of resistor 323 is connected to ground. The other end of diode 307 is connected to one of the terminals of toggle switch 311, and the other end of toggle switch 311 is connected to row decode 19. The other end of diode 315 is connected to one of the terminals of toggle switch 319, and the other end of toggle switch 319 is connected to row decode 19.

One of the inputs of AND gate 303 is connected to column decode 20, and the other input to AND gate 303 is connected to one of the ends of resistor 324, one of the ends of diode 308 and one of the ends of diode 316. The other end of resistor 324 is connected to ground. The other end of diode 308 is connected to one of the terminals of toggle switch 312, and the other end of toggle switch 312 is connected to row decode 19. The other end of diode 316 is connected to one of the terminals of toggle switch 320, and the other end of toggle switch 320 is connected to row decode 19.

One of the inputs of AND gate 304 is connected to column decode 20, and the other input to AND gate 304 is connected to one of the ends of resistor 325, one of the ends of diode 309 and one of the ends of diode 317. The other end of resistor 325 is connected to ground. The other end of diode 309 is connected to one of the terminals of toggle switch 313, and the other end of toggle switch 312 is connected to row decode 19. The other end of diode 317 is connected to one of the terminals of toggle switch 321, and the other end of toggle switch 321 is connected to row decode 19.

Column decode 20 and row decode 19 function by taking the selected output at logic one, i.e., a high level and keeping all the other outputs at logic zero, i.e., a low level. The output of AND gates 301–304 are connected to the input of OR gate 305, and the output of OR gate 305 is data that is connected to the input of modulation circuit 17. If switches 310, 311, 312 and 313, respectively, remain open, AND gates 301–304, respectively, will have a "zero" output. If switches 310, 311, 312 and 313, respectively, are closed, AND gates 301–304, respectively, will have a "one" output. The output of AND gates 301–304, respectively, will be read when switches 318–321, respectively, are closed.

Figure 3:
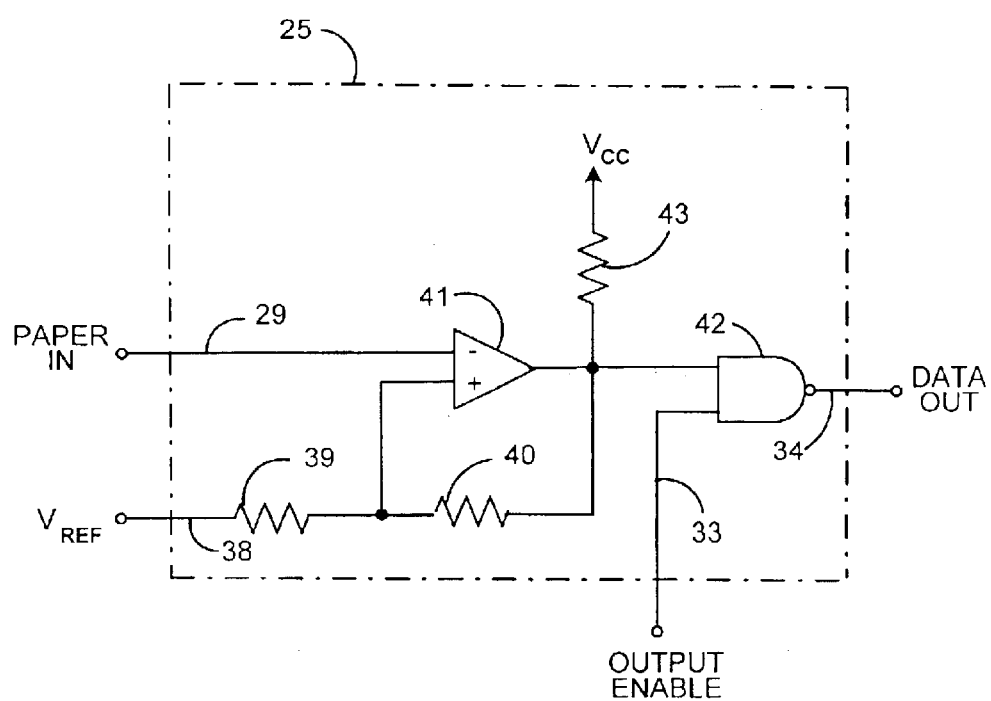
FIG. 3 is a drawing showing sensor circuit 25 of FIG. 2A in greater detail.

FIG. 3 is a drawing showing sensor circuit 25 of FIG. 2A in greater detail. The negative input of comparator 41 is connected to line 29, and the positive input of comparator 41 is connected to line 38. Comparator 41 may be a LM339N comparator. One end of line 38 is connected to a 2–3 volt reference voltage, and the other end of line 38 is connected to one of the ends of resistor 39. The other end of resistor 39 is connected to the positive input of comparator 41 and one of the ends of resistor 40. The other end of resistor 40 is connected to the input of NAND gate 42, the output of comparator 41 and one of the ends of resistor 43. The other end of resistor 43 is connected to a source voltage to act as a pull up resistor. The other input to NAND gate 42 is enable output 33. The output of gate 42 is data output 34. Resistor 39 may be 47,000 ohms, and resistor 40 may be 470,000 ohms. Resistor 43 may be 1,000 ohms. Comparator 41 has a positive feedback to provide a small amount of hysteresis Sensor circuit 25 is a differential circuit that accommodates variations in the conductivity of the conductive material. The conductive material may be used as a voltage divider to produce $V_{ref}$ on line 38 under the same conditions experienced by conductive material. It will be obvious to one skilled in the art that sensor circuit 25 may replace switches 310–313 and 318–321 of FIG. 2B.

Figure 4:
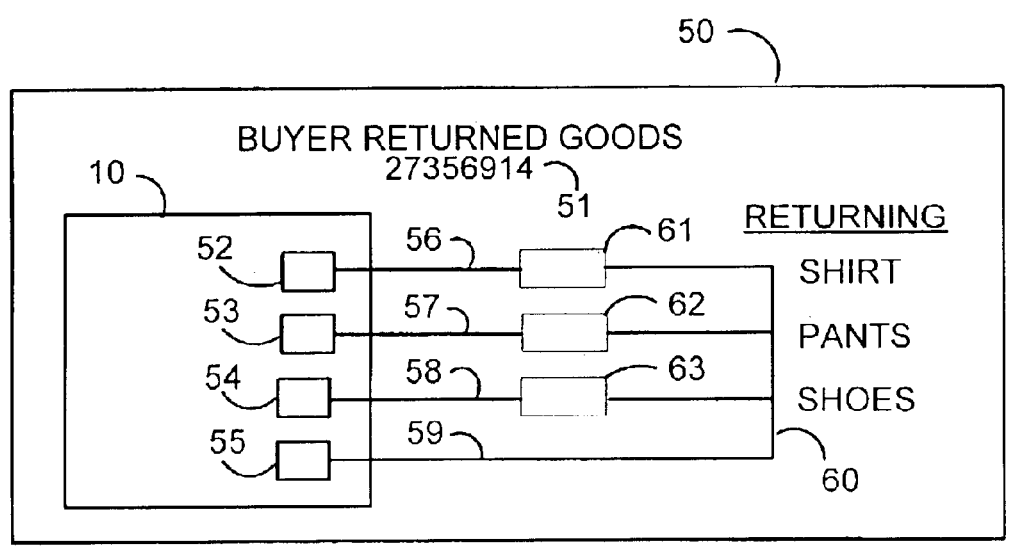
FIG. 4 is a seller furnished form to be completed by a buyer returning goods to a seller.

FIG. 4 is a seller-furnished form to be completed by a buyer returning goods to a seller. RFID circuit 10 is attached to paper 50 by means of a conductive adhesive such as an anisotropic adhesive (not shown). The seller places a returned goods identification number 51 on the form to identify the buyer by writing the invoice number for the purchased goods on paper 50 in a manner that number 51 may be read by a RFID reader. Graphite contacts 52, 53, 54 and 55 and lines 56, 57, 58, 59 and 60 are printed on standard bond paper, standard photocopier paper, standard computer paper, etc., by a standard computer printer like the model Desk Jet 880C printer manufactured by Hewlett Packard using a Hewlett Packard 45 black ink cartridge.

If the buyer decides to return a shirt to the seller, the buyer uses a graphite pencil, i.e., number 2, HB, etc., or a Paper Mate® black ball point pen to fill in rectangle 61. If the buyer decides to return pants to the seller, the buyer fills in rectangle 62 with a graphite pencil, and if the buyer decides to return shoes to the seller, the buyer fills in rectangle 63 with a graphite pencil. If the buyer changes his/her mind regarding the goods to be returned or makes a mistake in filling in one of the rectangles, the buyer could erase the penciled marking in the rectangle with a pencil eraser so that a RFID reader would only read what the buyer indicated on the finished form. The buyer would insert the finished form into a package (not shown) containing the returned goods, and the seller would be able to read the completed form When he/she receives the package with a RFID read without opening the package. The filling in of any of rectangles 61-63 or no rectangle 61-63 with a pencil will form a bar code that may be read by an optical scanner.

FIG. 5 is a drawing showing how an identification device, i.e., document, personal identification card, property identification device, file identification device, prescription identification device, book identification device etc. has markings to enable a RFID modified circuit to identify the document. A plurality of conductive graphite markings 355 is printed on document 353 that contains information. Markings 355 are printed in a manner that they will represent a code that identifies document 353. When label 325 is placed over markings 355 and the appropriate contacts on label 325 (described in FIG. 6) are touched the code represented by marking 355 with be associated with document 353. It will be obvious to one skilled in the art that document 353 may also be a personal identification card, property identification pass, file identification device, prescription identification label, book identification device etc.

Figure 6:
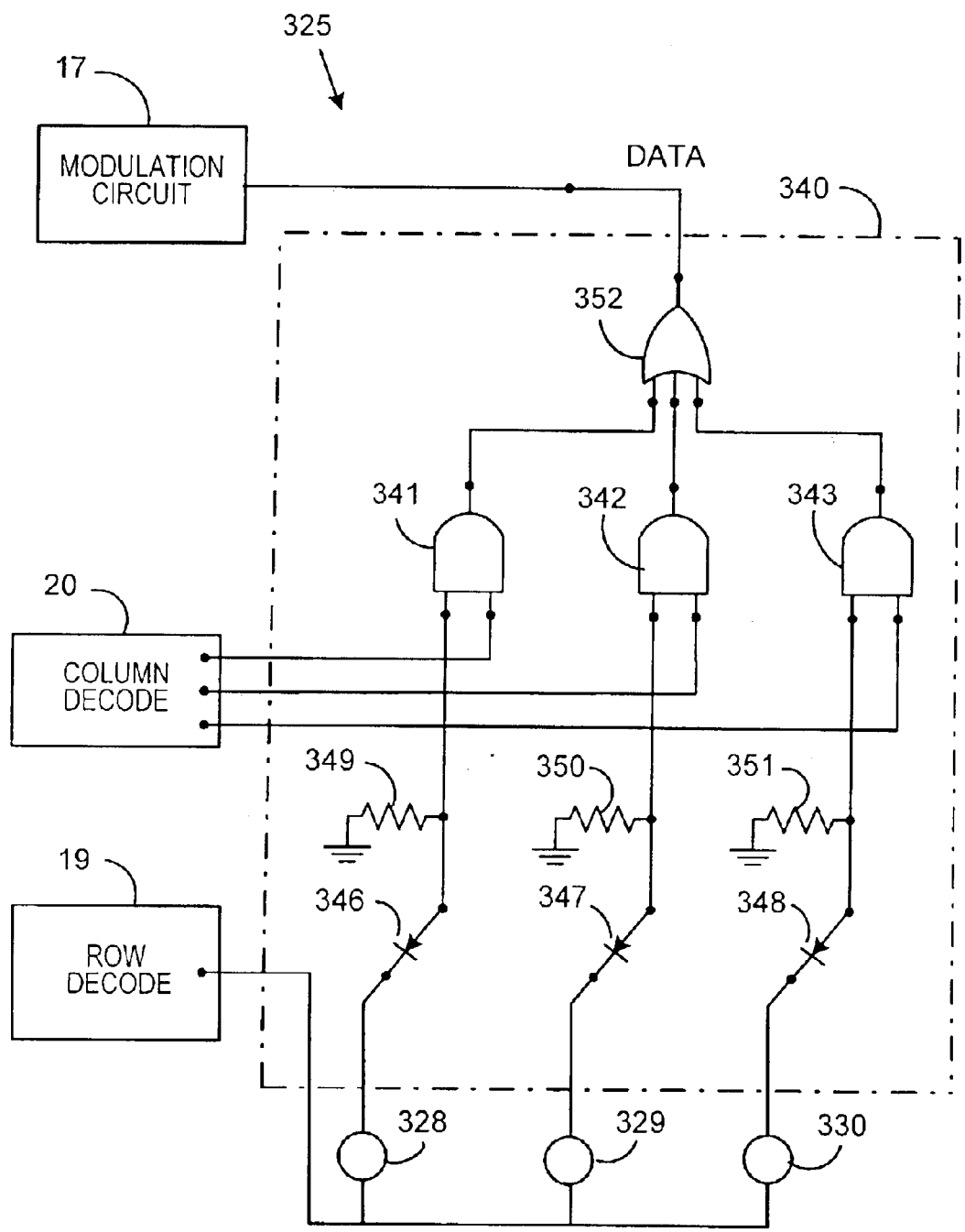
FIG. 6 is a drawing showing circuit 325 of FIG. 5 in greater detail.

FIG. 6 is a drawing showing circuit 325 of FIG. 5 in greater detail. Circuit 325 is essentially the same circuit shown as circuit 10 of FIG. 1 with circuit 340 replacing memory array 21 of FIG. 1. One of the inputs of AND gate 341 is connected to column decode 20, and the other input to AND gate 341 is connected to one of the ends of resistor 349 and one of the ends of diode 346. The other end of diode 346 is connected to one of the ends of graphite contact 328. The other end of resistor 349 is connected to ground. The other end of contact 328 is connected to row decode 19.

One of the inputs of AND gate 342 is connected to column decode 20, and the other input to AND gate 342 is connected to one of the ends of resistor 350 and one of the ends of diode 347. The other end of diode 347 is connected to one of the ends of graphite contact 329. The other end of resistor 350 is connected to ground. The other end of contact 329 is connected to row decode 19.

One of the inputs of AND gate 343 is connected to column decode 20, and the other input to AND gate 343 is connected to one of the ends of resistor 351 and one of the ends of diode 348. The other end of diode 348 is connected to one of the ends of graphite contact 330. The other end of resistor 351 is connected to ground. The other end of contact 330 is connected to row decode 19.

The output of AND gates 341, 342 and 343 is connected to the input of OR gate 352, and the output of OR gate 352 is data that is connected to the input of modulation circuit 17. If contacts 328, 329 and 330 are not touched, they will remain open, AND gates 341–343, respectively, will have a "zero" output. If contacts 328, 329 and 330 are touched, they will be closed, respectively, and when column decode 20 provides a "one" output to one of AND gates 341, 342 and 343, that AND gate that received an input from column decode 20 and was touched will have a "one" output. AND gates 341, 342 and 343, supply their outputs to the inputs of OR gate 352 which provides its output to the input of modulation circuit 17. This causes modulation circuit 17 to transmit a "one" or a "zero" out of RFID circuit 10 in accordance with the output of AND gates 341, 342 and 343.

It would be obvious to one skilled in the art that the output of circuit 340 may be combined with the output of a read only memory device in which a unique number is stored. Thus, when RFID circuit 10 is read the unique number is read along with the status of contacts 328, 329 and 330.

The above specification describes a new and improved circuit and RFID type circuit used in personal identification and document identification systems that uses printed lines to perform the function of wires so that information may be modified in the RFID type circuit by having an individual connect different printed lines by drawing a penciled line between the printed lines. It is realized that the above description may indicate to those skilled in the art additional ways in which the principles of this invention may be used without departing from the spirit. Therefore, it is intended that this invention be limited only by the scope of the appended claims.

What is claimed is:

1. A method for sending information from identification documents having a radio frequency identification (RFID) circuit with a number generation portion that is activated when the RFID circuit is read, said method comprising the steps of:

a) exposing on a material data bits of the number generation portion of the RFID circuit in a manner that the data bits will represent binary ones or zeros; and b) altering on a material the data bits of the number generation portion of the RFID circuit in a manner that the data bits will represent binary ones or zeros to identify the identification document.

2. The method claimed in claim 1, wherein the altering step further comprises: filling in the exposed bits with a graphite pencil.

3. The method claimed in claim 2, further including the step of: erasing the filled in bits to modify the information.

4. The method claimed in claim 1, wherein the altering step further comprises: filling in the exposed bits with an ink jet printer.

5. The method claimed in claim 1, wherein the altering step further comprises: filling in the exposed bits with a ballpoint pen.

6. The method claimed in claim 1, further including the step of: erasing the filled in bits to modify the information.

7. The method claimed in claim 1, wherein the identification document is a personal identification document.

8. The method claimed in claim 1, wherein the identification document is a personal identification card.

9. The method claimed in claim 1, wherein the identification document is a document identification document.

10. The method claimed in claim 1, wherein the identification document is a file identification document.

11. The method claimed in claim 1, wherein the identification document is a book identification document.

12. The method claimed in claim 1, wherein the identification document is a property identification pass.

13. The method claimed in claim 1, wherein the identification document is a prescription label.

14. The method claimed in claim 1, further including the step of: applying a label with a RFID circuit contained on the label to the document with conductive ink so that the conductive ink will fill in the exposed bits.

15. The method claimed in claim 1, wherein the RFID circuit has a unique number generation portion that when combined with the number generation portion of the RFID circuit indicates when the RFID circuit is read which RFID circuit is being read.

16. The method claimed in claim 11 further including the step of:

marking information on the material to form a bar code.

* * * * *